United States Patent [19]
Motley et al.

[11] 3,931,584
[45] Jan. 6, 1976

[54] AUTOMATIC GAIN CONTROL

[75] Inventors: David M. Motley, Santa Ana; King Y. Cheng, Tustin, both of Calif.

[73] Assignee: Hycom Incorporated, Irvine, Calif.

[22] Filed: Sept. 12, 1974

[21] Appl. No.: 505,211

[52] U.S. Cl. ............................. 330/129; 330/133
[51] Int. Cl.² ........................................ H03G 3/22
[58] Field of Search ....... 330/29, 86, 127, 129, 133, 330/134

[56] References Cited
UNITED STATES PATENTS
3,525,948    8/1970    Sherer et al. ............... 330/86 X

*Primary Examiner*—James B. Mullins
*Attorney, Agent, or Firm*—Gordon L. Peterson

[57] ABSTRACT

An Automatic Gain Control responsive to an input analog signal having a significantly varying power level provides an output analog signal of substantially constant power level. An analog-to-digital converter samples the output analog signal and expresses the amplitude of the samples in digital words characterized by bits including a Most Significant Bit. The Automatic Gain Control is responsive to the digital characteristics of at least the Most Significant Bit of the digital words to amplify the output analog signal to the substantially constant power level. This permits amplification of the input signal to a level approaching the maximum level expressible by the digital words and significantly reduces the quantization noise of the converter by maximizing the number of digital words which are available to express the signal amplitude.

4 Claims, 6 Drawing Figures

AUTOMATIC GAIN CONTROL

BACKGROUND OF THE INVENTION

Automatic Gain Controls are widely used to automatically change the gain or amplification of an input signal to provide an output signal having a substanially constant power level. For example the power level of an input signal might vary within a range of 40 db while the power level of the output signal of a typical Automatic Gain Control might vary within a range of only ± 3 db.

These Automatic Gain Controls typically include an amplifier followed by an attenuator which has a plurality of taps adjacent pairs of which are separated, for example, by a signal attenuation of 6 db. If the input signal varies from zero to −40 db, the amplifier will typically have a constant amplification of +40 db. This will provide at the output of the amplifier a signal having a power level which varies between zero and +40 db.

By monitoring either the power or the RMS value of the input signal, the particular tap in the attenuator is chosen which most closely approximates the 0 db level. In the worst case, this zero db level may be centered between two taps which are separated, for example, by a power level of 6 db. Under these circumstances, chosing either of the taps would provide the signal at the output of the Automatic Gain Control with a power level which is 3 db off the desired 0 db level.

In this manner, the Automatic Gain Controls of the prior art have reduced power level variation from a relatively high level such as −40 db to a relatively low level such as ± 3 db. Even with this significant reduction, the ± 3 db power level variations are undesirable and particularly adverse in digital applications.

In digital systems, the Automatic Gain Control is typically followed by an analog-to-digital converter. This converter samples the analog signal at the output of the Automatic Gain Control and provides a plurality of digital symbols or words each expressing the amplitude of the associated sample. The digital words or symbols are processed in the remaining portions of the digital system to detect the data transmitted. Each of the digital words includes digits or bits the number of which determine the maximum word length.

One problem with a significant power level variation in the output signal from the Automatic Gain Control is that, under certain conditions, the digital samples are grossly inaccurate. For example in some systems the maximum word length of the converter is used to express the peak level of a 0 db signal from the Automatic Gain Control. Theoretically this is desirable to increase the accuracy with which the amplitude of the samples are expressed. However, in the worst case where the power level of the signal from the Automatic Gain Control varies, for example, + 3 db, the converter attempts to express the resulting peak sample in a digital word having a length greater than the maximum word length. This undesirable result, which is commonly referred to as overflow or saturation produces grossly inaccurate symbols.

One method of reducing the probability of overflow or saturation is to reduce the amplification of the input signal so that extreme fluctuations in the power level do not exceed the maximum word length of the digital symbols. In this manner a particular portion of the word length is reserved to accommodate this undesirable power level fluctuation. This reduces the probability that a high noise signal would produce a digital symbol greater than that which could be expressed by the available word length.

By reserving a portion of the word length to reduce overflow, however, the remaining portion of the word length devoted to expressing the actual signal level is reduced. As a consequence, fewer digital words are available to express the actual signal level. This in turn results in an undesirable increase in the quantization noise of the sampler.

To express the signal strength more accurately, the word length of the symbols has been increased. However, increases in the word length are particularly expensive to implement since all portions of the system have been updated to accommodate symbols with additional bits per word. Furthermore, the increased word length does not reduce the quantization noise which has remained a significant source of performance degradation in these digital systems.

SUMMARY OF THE INVENTION

With the present invention, power level fluctuations at the output of the Automatic Gain Control are significantly reduced to a level such as ±0.5 db. Although the reduction in power level fluctuations at the output of the Automatic Gain Control is generally desirable, it is particularly desirable for digital applications in that the problems discusssd hereinabove can be easily and inexpensively solved. Specifically, when the present invention is used in a digital system, a much smaller portion of the available word length can be used to accommodate overflow and saturation This advantageously increases that portion of the symbol word length available to express the magnitude of the signal and thereby insures the most efficient use of the word length. By increasing the number of digital words available to express the signal level, the quantization noise of the sampler is significantly reduced.

With the Automatic Gain Control of this invention, a substantial reduction in power level fluctuations at the output is obtained by employing a plurality of Automatic Gain Control units such as a coarse Automatic Gain Control unit and a fine Automatic Gain Control unit. The coarse Automatic Gain Control unit receives an analog input signal which may have a power level which varies as much as 40 db. This coarse gain control provides a first signal with a power level which varies, for example, only ± 3 db. In response to this first signal, the fine Automatic Gain Control unit provides a second signal having a power level which varies, for example, only ± 0.5 db. Thus the quantization noise in the output signal of the analog-to-digital converter following the fine Automatic Gain Control unit is significantly reduced.

Substantial reductions in power level fluctuations at the output of the Automatic Gain Control can be obtained in other ways. However, the use of a plurality of Automatic Gain Control units is relatively inexpensive and more accurate than other methods which may be employed. Moreover, with a plurality of Automatic Gain Controls, each can be controlled independently in a manner to obtain the best possible results. Of course, any number of Automatic Gain Control units can be employed in order to obtain the desired reduction in power level fluctuations at the output, and the use of two such units as discussed herein is purely illustrative.

The present invention is based, in part, upon the recognition that substantial advantages are obtainable by digitally controlling the Automatic Gain Control. To accomplish this, the gain of the Automatic Gain Control can be adjusted in accordance with signals derived from a sampler which converts the analog signal from the Automatic Gain Control to a digital format.

The gain of the Automatic Gain Control can be adjusted by monitoring the Most Significant Bit (MSB) of the digital word. For a given type of data, it can be statistically determined how often the Most Significant Bit occurs in a particular interval of time. Using this number as a threshold level, the number of times the Most Significant Bit occurs can be counted and compared to the threshold level. If the count is greater than the threshold level, it is indicative of a power level greater than that desired. Under these circumstances the gain of the Automatic Gain Control can be reduced. In contradistinction, if the threshold level is greater than the count, the gain of the Automatic Gain Control can be increased.

If the Automatic Gain Control includes a plurality of Automatic Gain Control units, digital control can be utilized for any or all of the units. However, where coarse and fine Automatic Gain Control units are employed, the coarse Automatic Gain Control unit would be less capable of benefiting from the highly accurate digital control due to the relatively wide db separation of its taps. Accordingly, it is preferred to control the corase Automatic Gain Control unit in accordance with conventional practice. However, digital control of the fine Automatic Gain Control unit, whose taps are more finely divided, can provide a high degree of accuracy in response to the highly accurate digital control.

In addition, digital control is uniquely compatible with the fine Automatic Gain Control unit which provides relatively low power level fluctuations at the output. This allows a significantly greater portion of the word length of the sampler to be devoted to expressing the amplitude of the samples. As a result, the signal levels can be expressed more accurately without increasing the word length. This greatly reduces the quantization noise of the sampler and provides a more accurate digital control signal for the fine Automatic Gain Control unit.

These and other features and advantages of the present invention will be more apparent with a detailed description of the preferred embodiments discussed with reference to the associated drawings.

DESCRIPTION OF PREFERRED EMBODIMENTS

Figure 1:
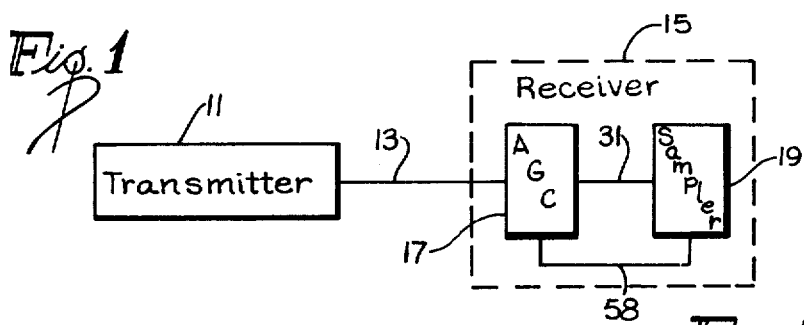
FIG. 1 is a block diagram of a transmitter and a receiver of the present invention including an Automatic Gain Control and an analog-to-digital converter.

A transmitter is shown in block diagram form in FIG. 1 and designated by the reference numeral 11. The transmitter 11 provides an analog output signal that is transmitted over a channel, such as a telephone line 13, to a receiver 15.

In many such systems, a different telephone line, such as the line 13, is dialed for each transmission by the trasnmitter 11. Since each line has its own characteristics, the power level of the signal at the input to the receiver may vary as much as 40 db. Even in a system employing a single channel, such as the telephone line 13, there may be significant variation in the power level of the input signal.

Figure 2:
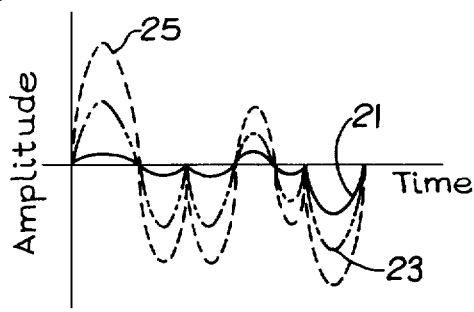
FIG. 2 is a graph illustrating waveforms of signals at the input and output of the Automatic Gain Control of FIG. 1.

These characteristics of the input signal are illustrated in FIG. 2 by a pair of waveforms 21 and 23. It will be noted that the waveforms 21 and 23 have coincident peaks which differ only in their magnitudes. Thus, the waveforms 21 and 23 have the same signal characteristics but different power levels. The peaks of the waveform 21, which are relatively low, provide the associated signal with the relatively low power level. In contrast, the relatively high peaks of the waveform 23 provide the associated signal with a relatively high power level. As noted, in a particular embodiment, the power levels of input signals having waveforms such as the waveforms 21 and 23 may vary as much as 40 db.

Throughout the remainder of the description, the signals and their associated waveforms will be referred to interchangeably and designated by the same reference numeral.

An Automatic Gain Control (AGC) 17 is included in the receiver to reduce fluctuations in the power level of the input signal. In response to the input signal, the Automatic Gain Control 17 provides an output signal which has a substantially constant power level. The substantially constant power level makes it possible to standardize manipulations of the signal throughout the remainder of the receiver 15.

It is a purpose of the AGC 17 to amplify the input signal, such as that shown by the waveforms 21 and 23, and to provide the signal at the output of the AGC 17 with a substantially constant power level. Such a gain controlled signal might have a waveform such as that shown at 25 in FIG. 2. As will be explained below, the AGC 17 is of even further advantage in a receiver, such as the receiver 15, which includes an analog-to-digital converter or sampler 19. In such a receiver, the sampler 19 converts the signal at the output of the AGC 17 from an analog format to a digital format.

In the past, Automatic Gain Controls have been responsive to power level fluctuations in the input signal to provide the gain controlled signal with fluctuations within a range of ± 3 db. These Automatic Gain Controls have monitored the power or RMS value (hereinafter referred to as the power level) of the input signal, and amplified this signal in accordance with a variable gain to provide a signal with reduced power level fluctuations.

The AGC 17 of the present invention includes a coarse AGC 27 of the conventional type. Thus the coarse AGC 27 is responsive to variations in the power level of the input signal to provide a coarsely controlled signal having a power level which may fluctuate within a range of ± 3 db. This coarsely controlled signal is then introduced to a fine AGC 29 which provides a finely controlled signal having a power level which varies within a range of only ± 0.5 db. After the input signal has been provided with coarse and fine adjustments in the AGC 17, the finely controlled signal is introduced to the sampler 19 on a conductor 31.

Figure 4:
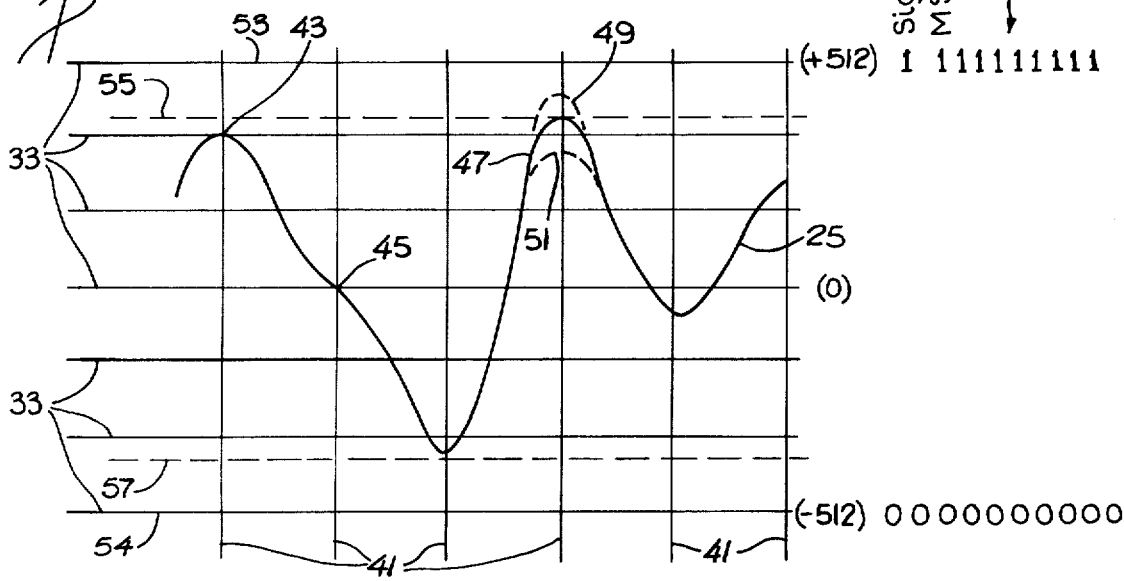
FIG. 4 is a graph illustrating a signal at the input to the analog-to-digital converter and the effect of power level variations on the symbols provided by the converter.

In the sampler 19, the finely controlled signal from the Automatic Gain Control 17, having a waveform such as that shown at 25 in FIGS. 2 and 4, is periodically sampled and the amplitude of each of the samples is expressed in a digital format as a digital word or symbol. At the output of the sampler 19, these digital words are typically stored in a register 20.

Each of the possible digital words is associated with a different threshold level such as those shown by the lines 33 in FIG. 4. Although only seven lines 33 are illustrated in FIG. 4, in a preferred embodiment there are 511 threshold levels. To express these different threshold levels, the digital output words, such as those shown at 35 adjacent to the associated threshold levels or lines 33, include a plurality of digits or bits each having a particular digital characteristic. For example, in a preferred embodiment, the digital output words 35 are characterized by ten digital bits including a Sign Bit 37 and a Most Significant Bit (MSB) 39. Ten bit digital words can express ± 511 different threshold levels.

In FIG. 4, the sampling times are illustrated by the vertical lines 41. At these sampling times 41, the analog waveform 25 from the AGC 17 is sampled and the magnitude or height of the sample is expressed as the particular digital word 35 associated with the nearest threshold level 33.

If there were no variations in the power level and no distortion in the input signal, the waveform 25 would pass through points defined by the intersection of the lines 33 and 41. A pair of these points are designated by the reference numerals 43 and 45 in FIG. 4. Under these circumstances the samples would have values which corresponded exactly to the quantities expressed by the digital words 35.

Unfortunately there are variations in the power level of the signal 25 even at the output of the AGC 17. Thus at the sampling times 41, the samples may have amplitudes which vary somewhat from the threshold levels 33 expressed by the digital words 35. These variations in the magnitudes of the samples from the accurate threshold levels result from what is commonly referred to as quantization noise.

Figure 5:
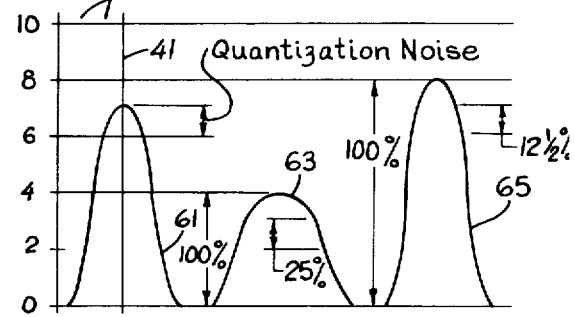
FIG. 5 is a graph illustrating the relationship between signal power level and quantization noise.

An example of quantization noise is illustrated in FIG. 5. The even numbers from zero to ten along the left-hand side of FIG. 5 correspond to different threshold levels in an analog-to-digital converter such as the sampler 19. Plotted with respect to these threshold levels are various signal peaks 61, 63, and 65 which might typically occur in different signals, such as the signal 25. These signal peaks 61, 63, and 65 are illustrated together in FIG. 5 only as a basis for comparison.

The peak 61 is illustrative of the concept of quantization noise. It will be noted that the peak 61 extends to a level between the threshold levels marked "6" and "8" at the sampling time shown by the line 41. Although the magnitude of the resulting sample should be "7", the sampler 19 in this example only has the capacity to express the sample as a "6" or an "8". It is the difference between the actual magnitude of the sample, such as 7, and the number used to express that magnitude, such as 6, which is commonly referred to as quantization noise. It can be seen that the maximum quantization noise is equal to one half the difference between the magnitudes of the adjacent threshold levels.

With respect to the present invention, the quantization noise is particularly undesirable at a maximum level of the waveform 25 such as that shown by a peak 47 in FIG. 4. Since the magnitude of the peak 47 varies with the power level of the signal at the output of the AGC 17, the peak 47 may be higher with a positive db variation as shown by the dotted line 49, or lower with negative db variation as shown by the dotted line 51.

Ideally the power level at the output of the AGC 17 would be constant so that maximum peaks, such as the peak 47, in the waveform 25 would extend to a maximum threshold level as shown by the particular threshold level 53. A sample of this maximum peak would correspond to the maximum digital word such as the 10 bit word 1111111111. Under these noiseless circumstances a maximum peak in an analog signal could be expressed by the maximum digital word. This is desirable since it provides for maximum utilization of the bits in the digital words 35. In other words, each of the possible digital words 35 could be used to express a particular signal level without regard to noise.

Of course there are variations in the power level of the signal 25; and a maximum peak, such as the peak 47, which is permitted to extend to the line 53 at a nominal zero db level, could actually extend beyond line 53 with positive decibel variation in the power level. This is particularly undesirable in the receiver 15 since the ten-bit register 20 providing the digital words 35 in the embodiment of the converter 19 would attempt to express the signal level as an 11 bit digital word such as 10000000000. Since only the last 10 bits would appear in the register 20, however, the actual level of the signal 26 would be expressed as the last ten bits of the 11 bit digital word, 0000000000. This is commonly referred to as overflow or saturation. Since the digital word 0000000000 is indicative of a sample having no amplitude, it can be seen that the overflow or saturation produces a digital word which is highly inaccurate. Instead of indicating a sample slightly greater than the maximum peak, the digital word shows the sample to have a peak of 0 amplitude.

For this reason the amplification of the signal by the AGC 17 is commonly limited so that at a nominal 0 db level the peaks of the signal 25 do not actually extend to the maximum positive and negative threshold levels 53 and 54 respectively. In FIG. 4, for example, a positive limit is shown by the dotted line 55, a negative limit is shown by the dotted line 57, and the signal 25 at a nominal zero db level is amplified to vary between the dotted lines 55 and 57.

The distance between the lines 53 and 55 and the distance between the lines 54 and 57 are referred to as the margins of the sampler 19. Each of these margins has a width which corresponds to fluctuations in the power level of the finely controlled signal at the output of the AGC 17. If the power level fluctuates ± 3 db, the margins will be six times as great as margins corresponding to power level fluctuations of only ± 0.5 db. Thus even a particular maximum peak, such as the peak 47, which is amplified to extend to the limit line 55 at a 0 db level and which might further extend beyond the limit line 55 as a result of positive power level variations, would still not extend beyond the maximum threshold level as shown by the line 53. In this manner, the margins insure that power level variations do not cause overflow and saturation.

It is desirable that the margins defined by the lines 53, 55 and 54, 57 be as narrow as possible so that the number of digital words reserved to accommodate power level variations can be minimized. This provides for maximum utilization of the bits in the digital words 35 in a manner which can be understood with reference to FIG. 5.

It will be noted that the maximum signal peaks 63 and 65 have different power levels. Although each of the peaks 63 and 65 is a maximum peak extending 100% of the maximum amplitude of the associated signal, the peak 65 is taller than the peak 63 because the power level of its associated signal is greater.

Of particular interest in this comparison is the magnitude of the quantization noise which can result from the different power levels of the peaks 63 and 65. As noted with reference to the peak 61, the maximum quantization noise is equal to one half the difference between the adjacent threshold levels. This is the maximum extent to which the digital expression for a sample can differ from the actual sample level. It will be noted with respect to the peak 63, that this one difference between the adjacent threshold levels corresponds to 25% of the maximum peak 63. In comparison the maximum quantization noise which can occur with reference to the peak 65 is equal to only 12½% of the height of the peak 65. It follows that as the general rule, the lower power levels produce a higher quantization noise than that produced by the higher power levels. This results from the fact that there are fewer digital words available to express the samples of the low level signals than are available to express the samples of the high level signals.

In the present invention the fine AGC 29 is responsive to the characteristics of the digital words 35 and therefore is capable of tracking slight deviations in the power level of the signal 25. This makes it possible for the fine AGC 29 to minimize power level fluctuations so that the size of the margins defined by the lines 53, 55 and 54, 57 can be significantly reduced.

In a two's compliment system, the Sign Bit 37 and the Most Significant Bit 39 in the digital words 35 occur as a digital ZERO and a digital ONE respectively for the higher positive threshold levels including that designated by the line 53. For the higher negative threshold levels, the bit 37 will be a digital ONE and the bit 39 will be a digital ZERO as shown in FIG. 4. Thus, the digital characteristics of the bits 37 and 39 in the digital words 35 can be monitored to provide an indication of the power level of the signal 25.

For a given type of data, it can be statistically ascertained the number of times the digital ZERO-ONE and ONE-ZERO occur in the respective bits 37 and 39 for a given power level and over a particular interval of time. For example in a given type of data, it may be ascertained that for a signal having a 0 db power level at the limit line 55, the ZERO-ONE and ONE-ZERO combinations of the bits 37 and 39 respectively may occur one hundred times in a period corresponding to 1,000 samples.

Figure 3:
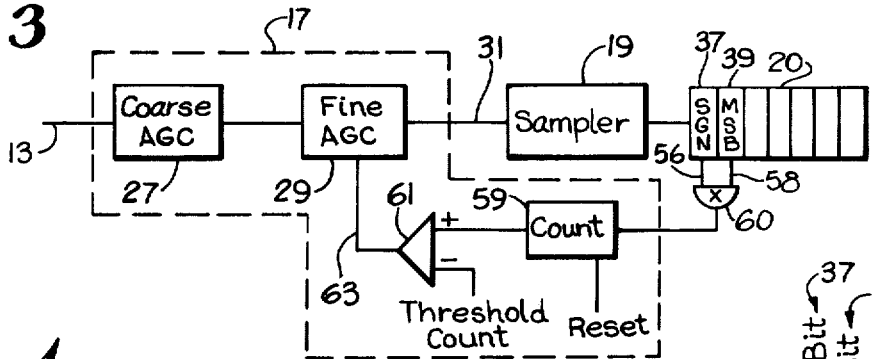
FIG. 3 is a block diagram illustrating in greater detail one embodiment of the receiver illustrated in FIG. 1.

Referring now to FIG. 3, it will be noted that in a preferred embodiment a counter 59 is coupled to the register 20 through an exclusive OR gate 60. The digital characteristics of the Sign Bit 37 in the register 20 are monitored by a conductor 56 which provides one input to the gate 60. The digital characteristics of the Most Significant Bit 39 in the register 20 are monitored by a conductor 58 which provides another input to the gate 60. At the output of the gate 60, a digital ONE is provided each time a ZERO-ONE or ONE-ZERO combination occurs in the Sign Bit 37 and the Most Significant Bit 39 of the register 20. The digital ONEs occurring at the output of the gate 60 are counted by the counter 59 and the resulting count is introduced to the positive input terminal of the comparator 61. A threshold count which typically is equal to the number of times the ZERO-ONE and ONE-ZERO combination should occur over the particular interval of time and at the particular power level is introduced to the negative input terminal of the comparator 61.

In a particular embodiment, the threshold count may be 100. If, in the particular interval of time, the count of the counter 59 exceeds the threshold count, the comparator 61 will provide a positive output signal on a conductor 63. If the count of the counter 59 is less than the threshold count, the comparator 61 will provide a negative output signal on the conductor 63. In response to a positive output signal on the conductor 63, the Fine AGC 29 can decrease the power level of the signal 25. Similarly in response to a negative signal on the conductor 63, the Fine AGC 29 can increase the power level of the signal 25. In this embodiment, the count of the counter 59 is reset to zero after each particular interval of time, such as that corresponding to 1,000 samples of the sampler 19.

It will be apparent to those skilled in the art that any combination of the digits including the digit corresponding to the Most Signficant Bit 39 can be monitored to control the amplification of the AGC 17. It is desirable that the digit corresponding to the Most Significant Bit 39 be included among the digits monitored, since it is the digit more closely associated with the maximum power level of the signal 25.

Figure 6:
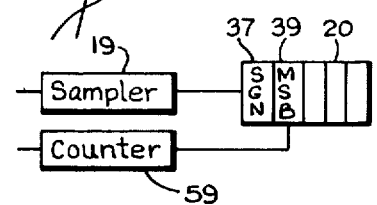
FIG. 6 is a block diagram of a further embodiment of the receiver illustrated in FIG. 1.

In an embodiment of the sampler 19 wherein the digital words 35 are expressed in a "sign-magnitude" system the positive 10 bit digital words 35 increase in value from 0000000000 to 0111111111. The negative ten-bit digital words 35 decrease in value from 0000000000 to 1111111111. In such an embodiment a digital ONE in the Most Significant Bit 39 corresponds not only to a high positive peak in the signal 25 but also to a high negative peak. It follows that in such a system an indication of power level can be provided by monitoring the digital characteristics of only the Most Significant Bit 39. In such an embodiment, the conductor 58 can be introduced directly to the counter 59 and the gate 60 can be eliminated. This direct connection is illustrated in FIG. 6.

In a "2's compliment" system the positive ten-bit digital words 35 increase in value from 0000000000 to 0111111111. The negative 10 bit digital words 35 decrease in value from 1111111111 to 1000000001. In such a system, a digital ONE occurs in the Most Significant Bit 39 of the register 20 in response to the high positive peak in the signal 25 but also in response to a low negative peak in the signal 25. Therefore the monitoring of only the Most Significant Bit 39 in the "2's compliment" system is not indicative of power level. However, as previously explained, the ZERO-ONE and ONE-ZERO combinations in the Sign Bit 37 and Most Significant Bit 39 respectively occur only in response to the high positive and negative peaks respectively of the signal 25. These particular combinations can be monitored by the exclusive OR gate 60 as previously explained.

Thus a particular threshold count introduced to the comparator 61 will vary not only with the particular type of data, the power level, and the particular interval of time, but will also vary with the particular digital notation used to express the negative values of the signal 25.

By directly monitoring the digital characteristics of the digital output words 35, the fine AGC 29 is provided with a capability for tracking minute fluctuations in the power level of the signal 25. This makes it possible for the fine AGC 29 to reduce power level fluctuations from a magnitude of ± 3 db in the coarsely controlled signals to only ± 0.5 db in the finely controlled signal. In the manner previously discussed this decreases the margins defined by the lines 53, 55 and 54, 57, increases the maximum utilization of the bits in the digital words 35, and therefore reduces the quantization noise of the sampler 19.

Although these embodiments of the invention have been described with reference to the telephone line 13, it will be apparent that the AGC 17 can be advantageously used to correct power fluctuations in any signal without regard to the type of channel. Also, though the invention has been described with reference to the output words 35, having 10 bits, this particular number of digits is clearly a matter of design. From this discussion, other emmbodiments of the invention will now be apparent to those skilled in the art so that the scope of the invention should be ascertained only with reference to the following claims.

We claim:

1. An automatic gain control system adapted to receive a first analog signal having a first fluctuating power level comprising:

coarse automatic gain control means responsive to the first analog signal to amplify the first analog signal by a first gain to provide a second analog signal having a second power level which fluctuates less than said first fluctuating power level;

fine automatic gain control means responsive to said second analog signal to amplify the second analog signal by a variable gain to provide a third analog signal having a third power level, said third power level fluctuating less than said second power level;

first means responsive to said third analog signal for providing a digital signal related to the power level of said third signal;

said digital signal having a characteristic which statistically should occur a first number of times during a predetermined interval for the power level of the third analog signal;

means for counting the actual number of times said characteristic actually occurs during said interval;

means for comparing said first number with said actual number and for providing a gain control signal in response to such comparison; and said fine automatic gain control means being responsive to said gain control signal for varying the gain of said fine automatic gain control means to thereby adjust the power level of said third signal.

2. A system as defined in claim 1 wherein said digital signal includes a plurality of pairs of sign bits and most significant bits and said characteristic includes a predetermined combination of values of the sign bit and the most significant bit of each of said pairs of bits.

3. A system as defined in claim 1 wherein said digital signal has a sign bit and said characteristic includes said sign bit.

4. A system as defined in claim 1 wherein said digital signal has a most significant bit and said characteristic includes said most significant bit.

* * * * *